United States Patent [19]

Lu

[11] Patent Number: 4,918,340
[45] Date of Patent: Apr. 17, 1990

[54] GTO THYRISTOR CONTROL CIRCUIT

[76] Inventor: Chao-Cheng Lu, 4-4, Alley 27, Lane 143, Chun Kung Rd., Taipei, Taiwan

[21] Appl. No.: 256,315

[22] Filed: Oct. 11, 1988

[51] Int. Cl.$^4$ .............................................. H03K 17/72
[52] U.S. Cl. .................................... 307/638; 307/633; 307/642
[58] Field of Search ......................... 307/633, 638, 642

[56] References Cited

U.S. PATENT DOCUMENTS

| | | | |
|---|---|---|---|
| 3,198,989 | 8/1965 | Mahoney | 307/642 |
| 3,324,384 | 6/1967 | Jokl et al. | 307/642 |
| 3,566,157 | 2/1971 | Ong | 307/642 |
| 3,609,402 | 9/1971 | Ferro et al. | 307/642 |

Primary Examiner—John Zazworsky
Attorney, Agent, or Firm—Fleit, Jacobson, Cohn, Price, Holman & Stern

[57] ABSTRACT

A new GTO (gate turn-off) thyristor, especially one which can freely control the turn-on and turn-off of the SCR (silicon controlled rectifier) without affecting the features of the A.C. and D.C. function of the SCR i.e. the switching function of great current and high voltage which is impossible for transistor. The power consumption of the control circuits is very low and the power can be supplied by the input control source at the gate or by a separate source. With special design, this invention has little malfunction and is the best GTO thyristor in the world.

1 Claim, 2 Drawing Sheets

GTO THYRISTOR CONTROL CIRCUIT

BACKGROUND OF THE INVENTION

There are a lot of SCR turn-off methods but the SCR turn-off method of this invention is quite different from the conventional ones. Consider the SCR serving as a D.C. switch for example: When a turn-on voltage, is applied to the SCR gate, the SCR is caused to turn-on and the circuit of this invention works to keep the SCR on and to store electric energy for turn-off. When the turn-on voltage at the SCR gate is turned off, the circuit of this invention uses the stored electric energy to turn off the SCR. The turn-off action is so fast that it almost takes place at the same time as the turn-off signal, and no sparks occur. So it is very safe. When the pulse circuit works to send a positive pulse to the SCR gate, the SCR is turned on and the circuit of this invention works to keep the SCR on and to store electric energy for turn-off. When the voltage of the pulse at the SCR gate is zero, the SCR, with stored electric energy, is changed to its turn-off state. From the above, it is seen that by making use of the transient change of voltage at the gate, this invention makes the SCR change to its turn-off state and attains the objective to turn off the source current.

SUMMARY OF THE INVENTION

The GTO thyristor control circuit of this invention has a series circuit of a Zener diode and a resistor connected to the input circuit, and a capacitor connected to the rear end of the resistor in order to use the input circuit to find out the turn-on or turn-off state of the SCR gate and send a signal to the voltage comparator, lower limit comparator and upper limit comparator as the main signal source of the control circuit.

The input control source of the thyristor control circuit may be a D.C. voltage, A.C. voltage or pulse voltage so that it can control the turn-on and turn-off action of the SCR with little D.C. voltage, A.C. voltage or pulse voltage.

The SCR trigger circuit of the said thyristor control circuit has a diode in series with the SCR gate and resistor between the gate and cathode of the SCR to control the turn-on and turn-off action of the SCR by making use of the voltage change between the gate and cathode.

The GTO thyristor control circuit has a conventional SCR to serve as a main switch of the circuits.

The GTO thyristor control circuit of the invention also has three comparators: an upper limit comparator, a lower limit comparator and a voltage comparator to make an AND gate circuit have a high positive output voltage and a zero output voltage. And all the comparators have an OPAMP IC.

The GTO thyristor control circuit of the invention further has two sets of reference voltage circuits consisting of two zener diodes and two resistors to make the upper limit comparator and lower limit comparator have a base voltage for comparison with an unknown voltage by the two comparators.

The GTO thyristor control circuit of the invention additionally has a voltage comparator with a reference voltage taken from the parallel capacitor to find out the turn-on or turnoff state of the SCR gate.

The GTO thyristor control circuit of the invention also has an AND gate circuit i.e. an AND gate IC. When the outputs of the upper limit comparator, lower limit comparator and voltage comparator are all positive, the AND gate circuit sends out a positive voltage to actuate the discharge circuit and make the SCR change from turn-on to turn-off. When the output of the AND gate circuit is zero, the charge circuit works to charge the capacitor which stores electric energy. The AND gate circuit consists of two output circuits to actuate the discharge circuit and charge circuit respectively.

The GTO thyristor control circuit of the invention also has a discharge circuit consisting of an optical coupler, saturation circuit and capacitor. When the output of the AND gate circuit is positive, the optical coupler and saturation circuit of the discharge circuit operate to make the capacitor discharge electric energy to the cathode and anode of the SCR and to make the SCR change to its turn-off state.

DETAILED DESCRIPTION OF THE PREFERRED EMBODIMENT

Figure 1:
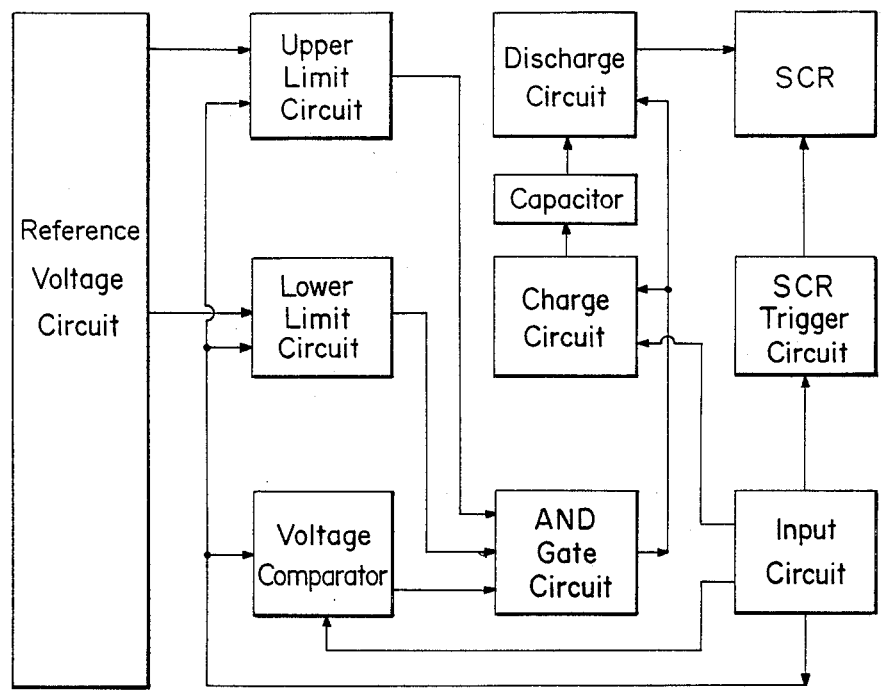
FIG. 1 is a block diagram of the GTO thyristor control circuit of this invention.
Figure 3A:
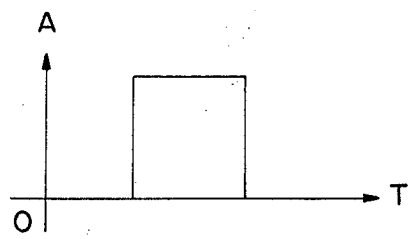
FIGS. 3($a$) and 3($b$) illustrate the turning-off of the SCR by the thyristor control circuit of the invention.
Figure 2:
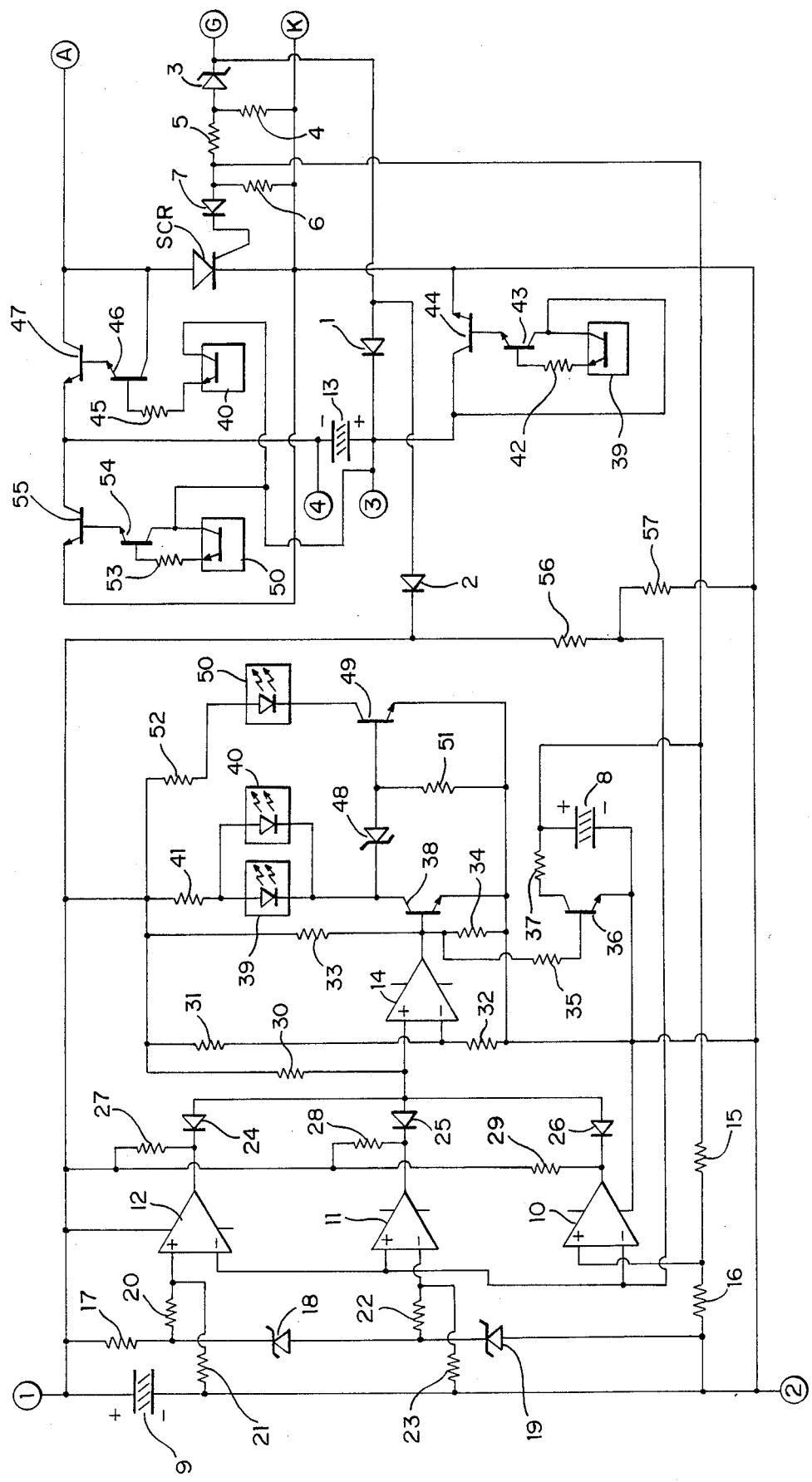
FIG. 2 is a circuit diagram of the GTO thyristor control circuit of the invention.

As shown in FIG. 2, when a pulse in the form as shown in FIG. 3($a$) is applied to the terminal G of the thyristor control circuit of this invention, it is divided into three signals and applied to the diode 1, diode 2 and Zener diode 3 respectively. The voltage which is higher than the Zener voltage of the Zener diode 3 passes the Zener diode 3 and load resistor 4 and the SCR input voltage from the load resistor 4 passes the voltage divider resistors 5 and 6 and becomes a turn-on voltage at the voltage divider resistor 6 as required by the SCR. The voltage from the voltage divider resistor 6 goes through the diode 7 to the gate of the SCR and makes the SCR change to its turn-on state, and the divided voltage also causes the capacitor 8 to be charged and is used as a reference voltage of the voltage comparator. The diode 7 is provided to prevent the high anode voltage from appearing at the input terminal when the SCR is in its turn-on state.

The voltage from the diode 2 is split into two branches. One branch voltage charges the capacitor 9 which stores electric energy for the control circuits of the present invention. The other branch voltage is sent to the inverting input of the voltage comparator as an input voltage of the voltage comparator 10 and to the non-inverting input of the lower limit comparator 11 and the inverting input of the upper limit comparator 12 as a comparison voltage. The resistor 56 and resistor 57 constitute an inverting input circuit of the voltage comparator 10.

The voltage from the diode 1 charges the capacitor 13 which stores electric energy for the turning-off of the SCR.

When a pulse is sent to the terminal G of the form as shown in FIG. 3($a$), the rise time is the turn-on time and the fall time is the turn-off time. The voltage sent to the inverting input of the voltage comparator 10 is used for the voltage comparator to determine if the terminal G is in an ON or OFF state. When the inverting input voltage of the voltage comparator 10 is higher than the non-inverting input voltage, the terminal G is in an ON state and the output of the voltage comparator is zero or negative. If the non-inverting input voltage is higher than the inverting input voltage, the output of the voltage comparator 10 is positive. The output terminal of the voltage comparator 10 is connected to the input terminal of the AND gate circuit 14 and the resistors 15 and 16 constitute a non-inverting input circuit of the voltage comparator 10. The non-inverting input voltage comes from the two terminals of the capacitor 8 while the inverting input voltage comes from the terminal G.

Figure 3B:
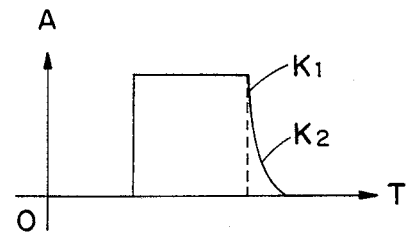

When the capacitor 9 is charged by the pulse from the terminal G, it provides the control circuit of this invention will supply voltage. When the resistor 17, Zener diode 18 and Zener diode 19 of the reference voltage circuits have voltage applied thereto, the Zener diode 18 and the Zener diode 19 output the Zener voltages of the Zener diode 18 and the Zener diode 19 respectively. The Zener voltage of the Zener 18 is sent to the non-inverting input of the upper limit comparator 12. The working (operating) point $K_1$ of the pulse of the terminal G is shown in FIG. 3(b). The Zener voltage of the Zener diode 19 is sent to the inverting input of the lower limit comparator 1 and its working (operating) point $K_2$ is shown in FIG. 3(b).

The non-inverting input reference voltage of the upper limit comparator 12 is the aggregated voltage of the Zener diodes 19 and 18, and the inverting input voltage comes from the terminal G. When the voltage of the terminal G is higher than the non-inverting input voltage, the output voltage of the upper limit comparator 12 is zero or negative. When the inverting input voltage is lower than the non-inverting input voltage, the output voltage of the upper limit comparator 12 is positive and is sent to the input terminal of the AND gate circuit 14. The resistors 20 and 21 constitute a non-inverting input circuit of the upper limit comparator 12.

The inverting input reference voltage of the lower limit comparator 11 is the Zener voltage of the Zener diode 19 and the non-inverting input voltage comes from the terminal G. When the voltage of the terminal G is higher than the inverting input voltage, the output voltage of the lower limit comparator 11 is positive. When the voltage of the terminal G is lower than the inverting input voltage, the output voltage of the lower limit comparator 11 is zero or negative. The output terminal is connected to the input gate of the AND gate circuit 14. The resistors 22 and 23 constitute an inverting input circuit of the lower limit comparator 11.

The AND gate circuit 14 consists of diodes 24, 25 and 26, resistors 27, 28, 29, 30, 31, 32, 33 and 34, and an OP AMP IC (operational amplifier integrated circuit). It can be replaced by a single AND gate IC. When the outputs of the upper limit comparator 12, lower limit comparator 11 and voltage comparator 10 are all positive, the input pulse of the terminal G is falling (i.e. in the fall time) and the working (i.e. operating) point falls between the points $K_1$ and $K_2$ as shown in FIG. 3(b). At this moment, the output of the AND gate circuit 14 is positive and the points $K_1$ and $K_2$ are adjustable by changing the Zener voltage of Zener diodes 18 and 19. When the input pulse is in the rise time, the output of the AND gate circuit 14 is negative or zero. This is one of the advantages of this invention.

When the output of the AND gate circuit 14 is positive, the positive output voltage goes through the current limit resistor 35 to the base of the transistor 36 (biasing the transistor on) and causes the capacitor 8 at the collector of the transistor 36 to discharge through the resistor 37 getting ready for the circuit to begin work again when the terminal is in the next ON state.

When the output of the AND gate circuit 14 is positive, the transistor 38, and optical couplers 39 and 40 are on and the voltage of the capacitor 13 goes through the saturation transistor circuit to the cathode and anode of the SCR and returns through the saturation circuit to the negative terminal of the capacitor 13. At this time, the SCR has back (i.e. reverse) voltage applied thereacross and changes from its turn-on state to its turn-off state. The saturation circuit of the SCR cathode consists of an optical coupler 39, resistor 42, and transistor 43 and 44 (on condition that the transistor 43 must have enough output voltage gain to make the transistor 47 become saturated). The two saturation circuits and capacitor 13 constitute a discharge circuit. This is one of the main parts of the present invention and the resistor 41 is the current limit resistor of the optical couplers.

Whe the output of the AND gate circuit 14 is negative or zero, the positive voltage of the collector of the transistor 38 goes through the Zener diode 48 to the base of the transisotr 49. At this time, the transistor 49 is biased on, the optical coupler 50 and the saturation circuit at the negative side of the capacitor 13 operate, and the capacitor 13 begins to charge. The resistor 51 is provided to keep the zero regular (i.e. off bias) voltage of the transistor 49 and the resistor 52 is provided to act as a current limit resistor of the optical coupler 50. The saturation circuit at the negative side of capacitor 13 consists of an optical coupler 50, resistor 53, and transistors 53 and 54. As a requirement of the present invention, the transistor 54 must have enough output voltage gain to make the transistor 53 become saturated.

With the diodes 1 and 2, the GTO thyristor control circuit of the present invention has its own power supply. Without the diodes 1 and 2, backward power (i.e. reverse voltage) can be supplied to the SCR through the terminals 3 & 4. Thus the present invention has the advantage of obtaining its power supply voltage by itself from the input and from a separate source.

What I claim is:

1. A GTO thyristor control circuit for controlling a gate turn-off (GTO) SCR thyristor having an anode, a cathode and a gate electrode and switching a load current, said control circuit comprising:
   a thyristor trigger circuit consisting of the gate and cathode electrodes of the thyristor;
   a turn-off voltage storage capacitor;
   an input circuit means operably coupled to the thyristor trigger circuit, for receiving a thyristor gate input voltage and for applying said thyristor gate input voltage to said thyristor, said input circuit means including:
   a first input circuit operably coupled in series with the gate electrode of said thyristor and in parallel with a load resistor and having a first zener diode in series with a first voltage divider and a first diode, said first input circuit receiving said thyristor gate input voltage and passing portions thereof exceeding the zener voltage of said first zener diode to said first voltage divider whereby the voltage from said first voltage divider is passed via said first diode and is applied as a turn-on voltage signal to the thyristor gate electrode for turning-on the thyristor;

a second input circuit operably connected to said voltage divider of said first input circuit and receiving the voltage therefrom, said second input circuit including a reference voltage storage capacitor, whereby said reference voltage storage capacitor is charged by the voltage from said voltage divider; and a third input circuit operably connected with said first and second input circuits and receiving said thyristor gate input voltage, said third input circuit including a diode provided in series with said turn-off voltage storage capacitor, for charging said turn-off voltage storage capacitor;

input reference voltage circuit means operably connected with said third input circuit and including a diode and a voltage divider, for receiving the thyristor gate input voltage and providing therefrom an input reference voltage;

limit reference voltage circuit means operably connected with said second input circuit reference voltage storage capacitor, for receiving voltage stored by said reference voltage capacitor and for providing therefrom an upper limit reference voltage and a lower limit reference voltage;

supply voltage storage circuit means including a supply voltage storage capacitor operably connected with said third input circuit and receiving said thyristor gate input voltage therefrom, for charging the supply voltage storage capacitor;

voltage comparator means operably connected with said reference voltage storage capacitor of said second input circuit and with said input reference voltage circuit means, for comparing the input reference voltage with the voltage on said reference voltage storage capacitor for thereby determining whether the thyristor is in an on state or an off state and providing a voltage comparator output signal in accordance therewith;

upper limit voltage comparator means operably connected with said input voltage reference circuit means and said limit reference voltage circuit means, for comparing the input reference voltage with the upper limit reference voltage for thereby determining whether the thyristor gate input voltage is above or below a predetermined upper working point voltage level and providing an upper limit voltage comparator output signal in accordance therewith;

lower limit voltage comparator means operably connected with said input voltage reference circuit means and said limit reference voltage means, for comparing the input reference voltage with the lower limit voltage for thereby determining whether the thyristor gate input voltage is above or below a predetermined lower working point voltage level and providing a lower limit voltage comparator output signal in accordance therewith;

AND gate circuit means having three inputs respectively operably connected to respective outputs of said voltage comparator means, upper limit voltage comparator means and lower limit voltage comparator means, for outputting an output signal having a first state when the respective states of said voltage comparator output signal, upper limit voltage comparator output signal and lower limit voltage comparator output signal are all coincident such as to indicate that the thyristor gate input voltage is falling and is between said predetermined upper and lower working point voltage levels, and for outputting an output signal having a second state when the respective states of said voltage comparator output signal, upper limit voltage comparator output signal and lower limit voltage comparator output signal are not coincident;

discharge circuit means operably connected to said input circuit means and said AND gate means and including a first saturation transistor circuit connected between said turn-off voltage storage capacitor and the anode and cathode of the thyristor, for operably connecting said turn-off voltage storage capacitor across the cathode and anode of said thyristor when the output signal of said AND gate circuit means attains said first state thereof, for discharging voltage stored in said turn-off voltage storage capacitor across the cathode and anode of said thyristor to thereby turn off said thyristor; and charge circuit means operably connected to said input circuit means and said AND gate means and including a second saturation transistor circuit connected between said turn-off voltage storage capacitor and the cathode of said thyristor, for operably connected the negative voltage terminal of said turn-off voltage capacitor with the cathode of said thyristor when the output signal of said AND gate attains said second state thereof, for thereby charging said turn-off voltage storage capacitor.

* * * * *